United States Patent
Juszkiewicz

(10) Patent No.: US 6,605,769 B1
(45) Date of Patent: Aug. 12, 2003

(54) MUSICAL INSTRUMENT DIGITAL RECORDING DEVICE WITH COMMUNICATIONS INTERFACE

(75) Inventor: Henry E. Juszkiewicz, Nashville, TN (US)

(73) Assignee: Gibson Guitar Corp., Nashville, TN (US)

( * ) Notice: Subject to any disclaimer, the term of this patent is extended or adjusted under 35 U.S.C. 154(b) by 0 days.

(21) Appl. No.: 09/972,340

(22) Filed: Oct. 5, 2001

Related U.S. Application Data

(63) Continuation-in-part of application No. 09/346,053, filed on Jul. 7, 1999, now abandoned.

(51) Int. Cl.[7] .......................... G04B 13/00; G10H 7/00
(52) U.S. Cl. ............................ 84/609; 84/602; 84/645; 84/721
(58) Field of Search .................. 84/609–614, 603–607, 84/645, 477 R, 478, DIG. 1, 721; 704/270, 500

(56) References Cited

U.S. PATENT DOCUMENTS

| | | | | |
|---|---|---|---|---|
| 5,491,774 A | * | 2/1996 | Norris et al. ............... 704/270 |
| 5,787,399 A | * | 7/1998 | Lee et al. .................... 704/270 |
| 5,814,752 A | * | 9/1998 | Rivera ..................... 84/DIG. 1 |
| 5,834,671 A | * | 11/1998 | Phoenix ................. 84/477 R X |
| 5,839,108 A | * | 11/1998 | Daberko et al. ............ 704/270 |
| 5,860,065 A | * | 1/1999 | Hsu ........................... 704/270 |
| 6,025,552 A | * | 2/2000 | Mukaino et al. .............. 84/605 |
| 6,252,830 B1 | * | 6/2001 | Hsu ........................... 704/500 |
| 6,342,666 B1 | * | 1/2002 | Shutoh ................. 84/477 R X |
| 6,353,172 B1 | * | 3/2002 | Fay et al. ..................... 84/609 |

* cited by examiner

Primary Examiner—Marlon T. Fletcher
(74) Attorney, Agent, or Firm—Waddey & Patterson; Lucian Wayne Beavers

(57) ABSTRACT

A portable device is used for recording, editing, and replaying musical sounds generated by a musical instrument external to the device. The musical sounds are converted from analog to digital format, compressed for minimum storage usage, and stored in a digital storage medium. The stored signals are filed according to an indexing scheme that allows selection and retrieval of selected portions of the musical sounds. The selected portions are retrieved from storage, decompressed, converted back to analog signals, and output to a sound generating device. The operation of the device is controlled by application software and operating system software.

40 Claims, 3 Drawing Sheets

MUSICAL INSTRUMENT DIGITAL RECORDING DEVICE WITH COMMUNICATIONS INTERFACE

This application is a continuation-in-part of U.S. patent application Ser. No. 09/346,053 filed Jul. 7, 1999, now abandoned, entitled "Musical Instrument Digital Recording Device With Communications Interface", the disclosure of which is hereby incorporated by reference.

BACKGROUND OF THE INVENTION

The present invention relates generally to audio recording and playback devices. More particularly, this invention pertains to recording and playback devices for use in conjunction with musical instruments that are external to the device.

Musicians frequently have a need or desire to record the music that they create on their instruments. In some cases, the recording is made for personal enjoyment. In other circumstances, a recording will be made for more commercial purposes, such as to make a record of a songwriting session, to create a song demo recording, to create a musical instrument track for editing or mixing, or for archival purposes. Generally, musicians who want to record their music while playing an instrument will have to make special arrangements in a recording studio or use amateur tape recording equipment of their own. While in the recording studio, the musician has access to a variety of sophisticated post-production recording, mixing, and editing equipment. In a home recording setting, editing options are usually far more limited. In either case, the musician must plan the recording session in advance including gathering and connecting sophisticated, bulky recording equipment. During the recording session, the musician is often distracted from the actual playing of the instrument because he must use his hands to control the recording equipment and/or to change or reload the recording media. Even if a musician uses a portable cassette or mini-disc recorder for convenience, neither is specifically adapted for connection directly to an instrument such as a guitar. Moreover, existing portable recording devices have limited functionality and versatility in terms of editing and external connectivity.

U.S. Pat. No. 5,837,912, issued to Eagen, describes an apparatus for digitally recording music from a guitar. The apparatus also allows the user to replay the digitally recorded music. However, the Eagen device does not allow a user to edit the digitally recorded music or to access selected portions of the digitally recorded music.

Conventional portable recording and playback devices from Sharp Corporation and Diamond, such as the Sharp MD-MT821 and the RIO PMP300, provide the ability to digital record music from compact discs or from the Internet for time periods ranging from 1 hour to 8 hours. They do not provide the ability to edit the recorded music or record for longer periods of time. Moreover, these devices are not adapted for recording music directly from a guitar or other musical instrument.

Thus, there is a need for an audio recording and playback device that may be conveniently carried and operated by a musician to record the music he or she creates with a musical instrument. Preferably, such a device will have both internal storage that can easily be cued and reviewed as well as an interface to an external storage and editing device.

SUMMARY OF THE INVENTION

The musical instrument direct recording and playback device of the present invention comprises an input stage including an audio signal format converter having two analog inputs and outputs, an output stage including two digital outputs, a digital signal processor; a control input device; an application software storage device; an application software program, an operating system storage device; an operating system software program, a digital storage device; and a display. The device can connect directly to the output jack of an external musical instrument for purposes of receiving analog audio signals as the instrument is played. On commands entered by a footswitch connected to the device, the device converts the received signals to digital format, compresses the digital signals, and stores and indexes the digital audio signals on an internal mass storage device. On receipt of further commands, the device can retrieve selected portions of the digital signals, decompress the retrieved signals, converts the retrieved signals to analog signals, and output the analog signals as a monaural or stereo audio signal. The device includes an external communications port and interface, such as from a Universal Serial Bus, to a personal computer. This allows the stored digital audio data to be up-loaded for storage and editing and/or new or updated software to be downloaded.

DESCRIPTION OF THE PREFERRED EMBODIMENTS

Figure 1:
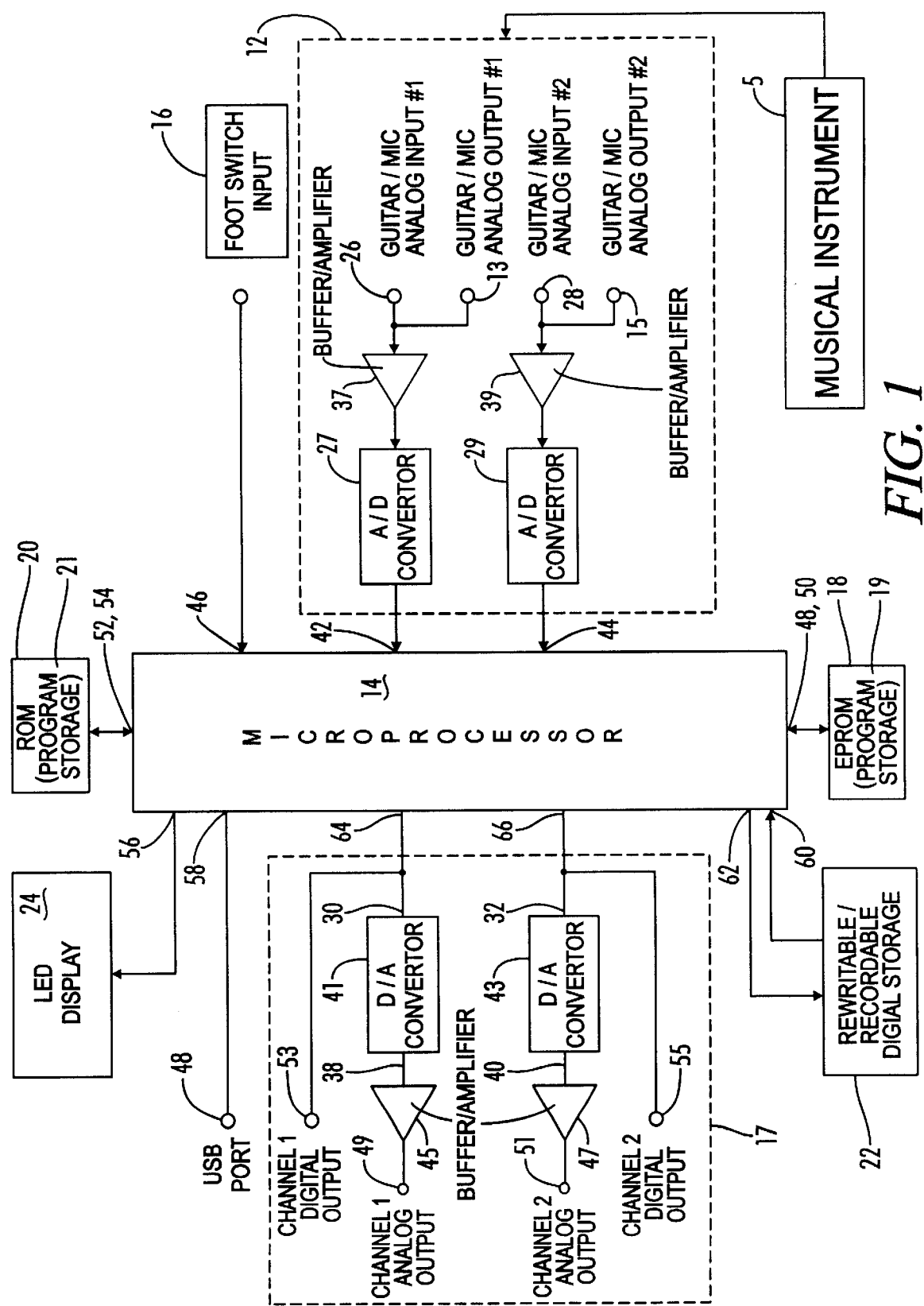
FIG. 1 is a schematic drawing of the musical instrument direct recording and playback device of this invention.

Referring to FIG. 1, the present invention of a musical instrument recording and playback device 10 includes a recording input stage 12 and playback output stage 17 connected to a digital signal processor 14, a control input device 16, an application software storage device 18, an application software program 19, an operating system storage device 20, an operating system software program 21, a re-writable digital mass storage device 22, and a display 24.

The input stage 12 includes a first analog input 26 connected to a first digital input 42 on the processor 14 through a first analog data converter 27, and a second analog input 28 connected to a second digital input 44 on processor 14 through a second analog data converter 29. Optionally, first and second buffer amplifiers 37 and 39 can be used between the analog inputs 26 and 28 and corresponding analog data converters 27 and 29. The converters 27 and 29 and be conventional A/D converters or CODEC devices capable of providing additional standard or proprietary format encoding on the input signals as they are converted to digital format at converter outputs 34 and 36.

The analog inputs 26 and 28 are conventional female audio jacks adapted to connect directly to the output of a conventional external musical instrument 5. The musical instrument 5 can be an electric guitar, keyboard, or other instrument that generates electrical analog and/or digital audio signals when the instrument is played by a musician. In a preferred embodiment, auxiliary audio output jacks 13 and 15 are hardwired directly to the analog inputs 26 and 28 so that an external connection can be made to other audio devices. In another embodiment of the invention, the device 10 can include digital signal inputs for direct connection to a musical instrument having a digital output. In this embodiment, the converters 27 and 29 would not need to perform an analog-to-digital conversion but would simply perform an encoding and/or decoding function to provide digital audio signals in the proper format.

The audio output stage 17 includes first and second digital outputs 64 and 66 on processor 14, connected at converter inputs 30 and 32 to corresponding first and second digital data converters 41 and 43. The outputs 38 and 40 of converters 41 and 43 can be buffered by buffer amplifiers 45 and 47 to provide analog audio output signals at first and second channel analog outputs 49 and 51. Optionally, separate first and second auxiliary digital outputs 53 and 55 can be connected to processor outputs 64 and 66 for connection to external digital audio devices. The digital converters 41 and 43 are conventional type D/A converters or CODEC devices.

In a preferred embodiment of the device 10, the converters 27, 29, 41, and 43 can be integrated into a single CODEC integrated circuit and package.

The primary function of the input and output stages 12 and 17 is to convert analog signals generated by the musical instrument 5 to digital format during recording, and to convert the recorded digital audio signals back to analog format during playback.

The digital signal processor 14 includes a first digital input 42, a second digital input 44, a control input 46, an application software storage input 48, an application software storage output 50, an operating system storage input 52, an operating system storage output 54, a display output 56, a computer communications port 58, a digital storage input 60, a digital storage output 62, a first digital output 64, and a second digital output 66. The processor 14 is of a conventional type found in the art such as the SHARC digital signal processor.

The primary function of the processor 14 is to compress the converted digital signals for storage purposes, store the compressed digital signals in files on the digital storage device 22, control and manage the digital storage device 22, receive inputs from the control input device 16, retrieve stored digital signals from the digital storage device 22, decompress retrieved digital signals, and send the decompressed digital signals to the converter 12 for conversion to analog signals. The processor 14 accomplishes all of the above tasks by using application software loaded on the application software storage device 18. The application software is described in detail below.

The digital signals are compressed to ensure that the digital signals use up a minimum amount of space on the digital storage device 22. In one embodiment of the device 10, the digital storage device can be a conventional low profile IDE hard disk drive, and the processor 14 can communicate and control the digital storage device 22 through a conventional IDE disk controller interface.

The processor 14 compresses the digital signal received through the first digital signal input 42 and the digital signal received through the second digital signal input 44. A compression algorithm is used to perform the compression. The compression algorithm is of the type commonly found in the art such as MPEG audio compression.

An external data port 48, such as a USB port of the conventional type found in the art, is used to transfer stored audio data and programming from the device 10 to a remote computer (not shown). The digital audio data that is uploaded from the device 10 can then be stored, edited, mixed, etc. and, if desired, downloaded back to the device 10.

Figure 2:
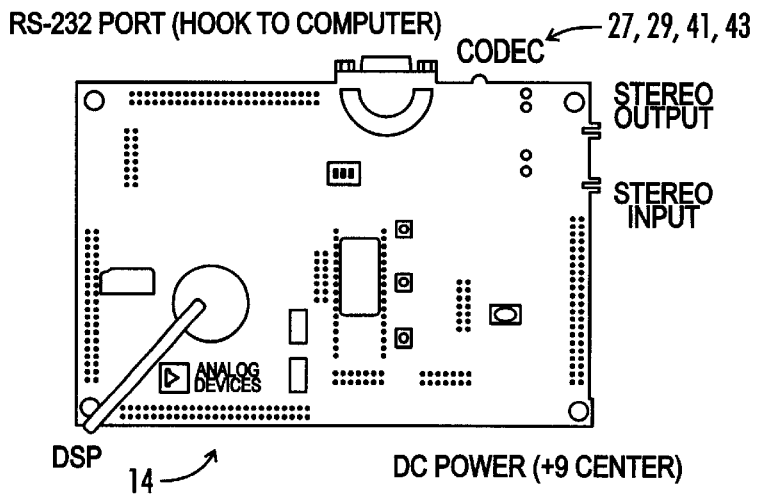
FIG. 2 is a plan view of a typical SHARC (Super Harvard ARChitecture) Digital Signal Processor device and circuit board that can be used in one embodiment of the device of the present invention.
Figure 3:
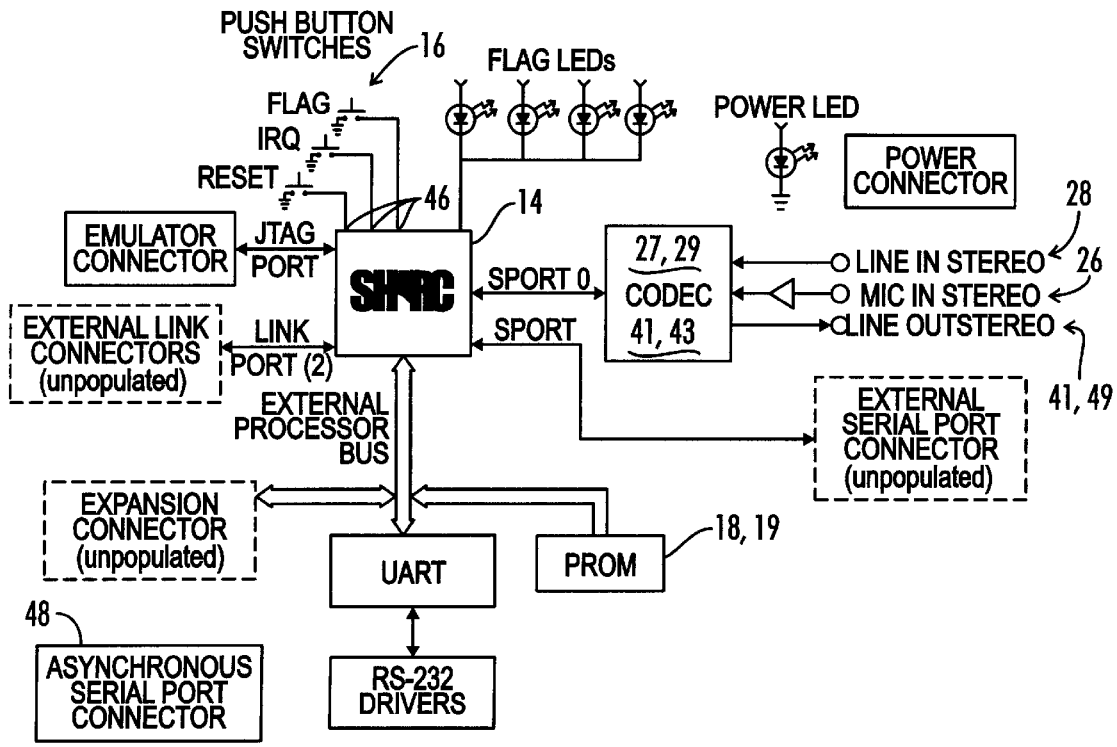
FIG. 3 is a block diagram of the SHARC DSP device and circuit shown in FIG. 2.

FIGS. 2 and 3 illustrate one physical embodiment of the device 10 shown in block diagram form in FIG. 1, and particularly using a conventional SHARC DSP circuit board as the microprocessor 14 with onboard non-volatile memory (not-shown). A standard RS-232 serial communications port 48 is used to communicate with external devices in this embodiment, rather than a USB port. A UART (Universal Asynchronous Receiver Transmitter) and RS-232 Drivers convert the data as needed by the processor 14 and external device (not shown) in conventional fashion.

In accordance with one novel feature of the invention, the control input device 16 can be a momentary contact or multiple position footswitch that is capable of sending electrical signals or commands to the processor 14 by a wired or wireless connection to control input 46. The control input device 16 generates control inputs to the processor 14 to control the operation of the device 10. For example, when the control input device 16 is pressed one time, a control input is generated and sent to the processor 14. The application software on the processor interprets this control input as a command to start and stop recording or to playback audio stored at a specific memory location.

Although the use of a footswitch that is hardwired to the device 10 is convenient for use by musicians who otherwise have their hands occupied, other conventional switches can be used, including switches operably connected to the device 10 by infrared or other conventional wireless means. Alternatively, a PC connected through a USB port can provide control commands to the device 10.

Figure 4:
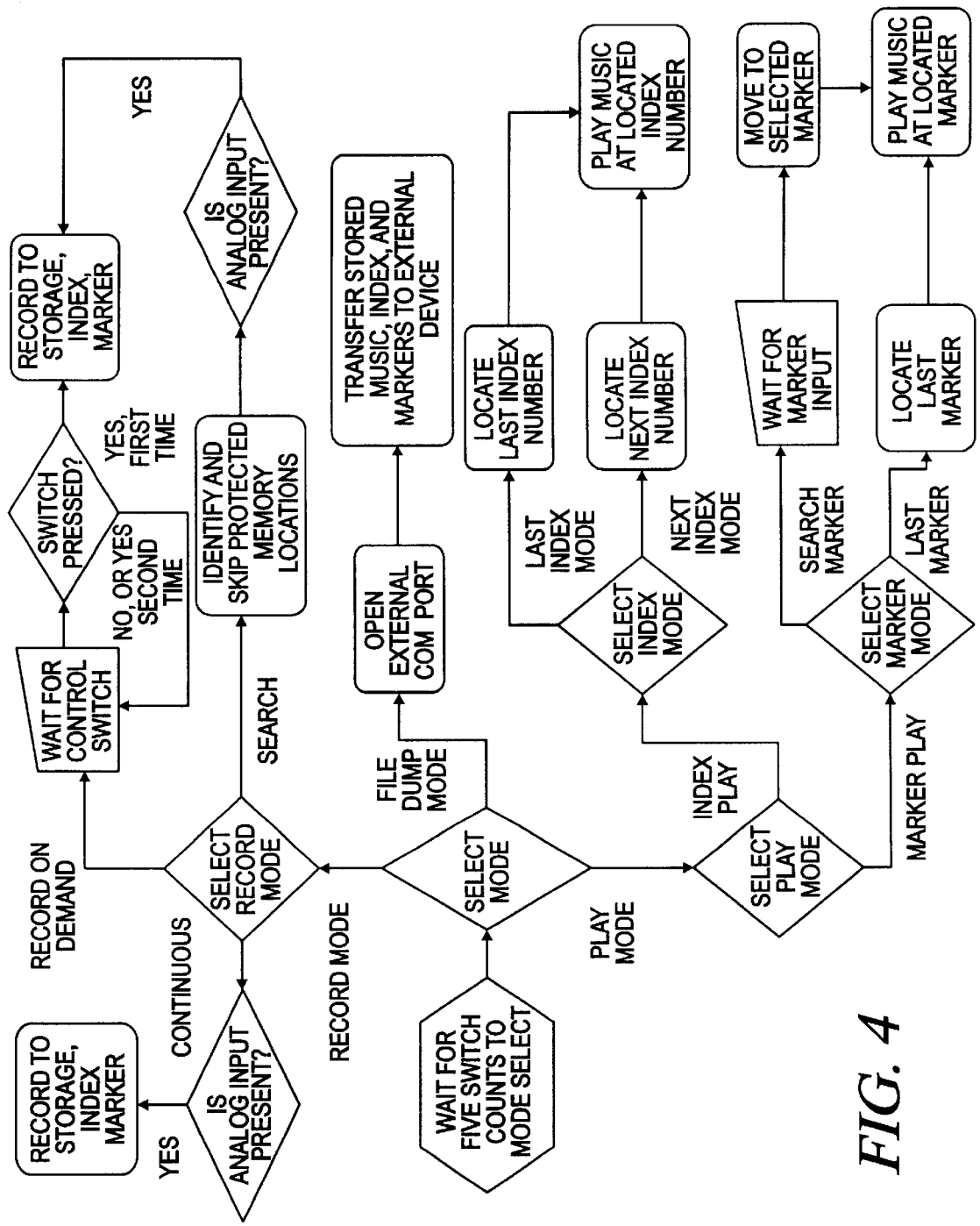
FIG. 4 is a flow chart showing the functional steps implemented by the software in one embodiment of the device of the present invention.

FIG. 4 is a flowchart describing the sequence of commands and responsive operations that are implemented by the software controlling the microprocessor 14 in one embodiment of the present invention. As seen on FIG. 4, the device can operate in one of multiple modes based on the Select Mode, Select Record Mode, and/or Select Play Mode prompted by the processor 14 and entered by use of the control input device (footswitch) 16. The primary modes include Select Record Mode, Select Play Mode, and File Dump Mode.

The record modes can include Record On Demand, Continuous Record, and Search. The Record On Demand mode requires further switch input by the user which, when received, initiates storage of audio signals along with generation of marker and indexing data. The Continuous Record mode activates recording, indexing, and marking whenever audio signals are present at a device input 26, 28. The play modes include Index Play mode causes the device to begin playback of recorded signals located at specified index numbers. Additional detail is shown in FIG. 4 and described below. A programmer familiar with the programming language/instruction set associated with a particular microprocessor 14 would create and store the corresponding instructions and commands in the program storage device, such as the PROM 18, 19 on FIG. 3.

The control input device 16 also controls the primary mode in which the device 14 is operating. When the control input device 16 is pressed five times in rapid succession, for example, the processor 14 enters a "Mode Setting Mode." The display indicates this mode by displaying a "555" on the display 24.

In a preferred embodiment, there are three recording modes for the musical instrument direct recording and playback device 10. The first recording mode is the Continuous Record Mode that is selected when the user presses the control input device 16 six times. In the Continuous Record Mode, the device 10 records whenever an analog signal is present on analog inputs 26 and 28.

The second preferred recording mode is the Record on Demand Mode that is selected when the user presses the control input device 16 seven times. In the Record on Demand Mode, the device 10 begins recording when the control input device 16 is pressed one time. The recording ends when the control input device 16 is pressed a second time. In one embodiment of the device, the processor is programmed to store audio data in six minute increments. If the control input device 16 is pressed when the device 10 is recording in the middle of a six minute recording increment, then a reduced mount of storage on storage device 22 will be used. For example, if a user records for three minutes and presses the control input device 16, the device 10 will stop recording. When the user presses the control input device 16 to start a new recording, the device 10 will skip the remaining three minutes of the preceding six minute increment and start recording at the beginning of the next six minute increment.

A third recording mode is the Search Record Mode, selected when the user presses the control input device 16 eight times. In the Search Record Mode, the device 10 will not record over certain specified memory locations that the user has designated as protected. For example, the user may have several hours of recorded audio stored on storage device 22. Within the second hour, and specifically, the first eighteen minutes of that hour, is recorded material that the user would like to keep stored at a specific memory location. The user designates this memory location as protected using the application software.

At some future time, the user may be recording over a memory location immediately preceding the memory location that the user would like to protect. When the device 10 reaches the protected material, the device 10 skips over the protected memory location and continues recording at the next available memory location.

In a preferred embodiment, there are four play modes for the device 10. The Play Next Index Mode allows the user to replay the audio data stored at the next index number. This mode is selected when the user presses the control input device 16 one time. The Play Back Last Index Mode allows the user to replay the audio stored at the last index number. This mode is selected when the user presses the control input device 16 two times. The Play Back Last Marker allows the user to replay musical sounds stored at the last marker. This mode is selected when the user presses the control input device 16 three times. The Play Back Search Marker Mode allows the user to replay musical sounds stored at a given marker. This mode is selected when the user presses the control input device 16 four times.

An additional File Dump Mode can also be used. This mode is selected when the user presses the control input device 16 nine times. In the File Dump Mode, the device 10 transfers audio files stored on storage device 22 to a separate computer using external communications port 58. The transferred data can include the corresponding index numbers and markers.

The application software storage device (ASSD) 18 is coupled to the processor 14. The ASSD 18 contains the application software program 19 that responds to and causes processor 14 to execute user commands.

The operating system storage device (OSSD) 20 is electrically connected to the processor 14. The OSSD contains the operating system software program 21 used to implement the compression of digital signals, store digital signals, retrieve stored digital signals, and transmit the retrieved digital signals to the output stage 17.

The operating system software 21, application software 19, and processor 14 cooperate such that the input stage 12 and output stage 17 can work concurrently, whereby new audio can be recorded and stored during the playback mode.

The digital storage device (DSD) 22 is electrically connected to the processor 14. The DSD 22 is of the type commonly found in the art such as an optical or magnetic disk drive. It should be noted that many other mass storage devices could be substituted for the hard disk drive. Examples of substitutes include non-volatile FLASH memory cards, etc. In one embodiment of the invention, the processor 14 is programmed to overwrite the first recorded digital audio data stored on the DSD 22 when the DSD 22 is full. Flash Memory is used for easy and fast information storage in such devices as digital cameras and home video game consoles. It is used more as a hard drive than as RAM. In fact, Flash Memory is considered a solid-state storage device. Known examples of Flash Memory include a PC's BIOS chip, CompactFlash (most often found in digital cameras), SmartMedia (most often found in digital cameras), Memory Stick (most often found in digital cameras), PCMCIA Type I and Type II memory cards (used as solid-state disks in laptops), and memory cards for video game consoles.

More particularly, Flash Memory is a type of EEPROM chip. It has a grid of columns and rows with a cell that has two transistors at each intersection. The two transistors are separated from each other by a thin oxide layer. One of the transistors is known as a floating gate and the other one is the control gate. The floating gate's only link to the row, or wordline, is through the control gate. As long as this link is in place, the cell has a value of "1". To change the value to a "0" requires a curious process called Fowler-Nordheim tunneling. Tunneling is used to alter the placement of electrons in the floating gate. An electrical charge, usually 10–13 volts, is applied to the floating gate. The charge comes from the column, or bitline, enters the floating gate and drains to a ground. This charge causes the floating gate transistor to act like an electron gun. The excited electrons are pushed through and trapped on other side of the thin oxide layer, giving it a negative charge. These negatively charged electrons act as a barrier between the control gate and the floating gate. A special device called a cell sensor monitors the level of the charge passing through the floating gate. If the flow through the gate is greater than fifty percent of the charge, it has a value of "1". When the charge passing through drops below the fifty percent threshold, the value changes to "0". A blank EPROM has all of the gates fully open, giving each cell a value of "1".

The electrons in the cells of a Flash Memory chip can be returned to normal ("1") by the application of an electric field, a higher voltage charge. Flash Memory uses in-circuit wiring to apply the electric field to the entire chip, or to predetermined sections known as blocks. This erases the targeted area of the chip, which can then be rewritten. Flash Memory works much faster than traditional EEPROMs because instead of erasing one byte at a time, it erases a block or the entire chip, and then rewrites it.

The CompactFlash and SmartMedia types of removable storage, as well as PCMCIA Type I and Type II memory cards, adhere to standards developed by the Personal Computer Memory Card International Association (PCMCIA).

Because of these standards, it is easy to use CompactFlash and SmartMedia products in a variety of devices. Standard adapters are available that allow the microprocessor 14 to access these cards through a standard floppy drive, USB port or PCMCIA card slot. SmartMedia cards erase, write and read memory in write and read memory in small blocks (256 or 512 byte increments).

In an embodiment of the device 10 where an external FLASH memory device is used for DSD 22, the digital storage input 60 and output 62 can be in the form of a second USB connector with an adaptor to connect to a SmartMedia or CompactFlash card, or a standard PCMCIA card connector with a PCMCIA FLASH memory device, all of which are conventional devices well known in the art. The microprocessor 14 reads and writes data to the FLASH memory type DSD 22 using the standards developed by the Personal Computer Memory Card International Association (PCMCIA).

The DSD 22 stores each digital audio signal as an individual file in six minute increments. It should be noted that the choice of six minute increments is arbitrary and may vary depending on the needs of the user. In addition, the DSD 22 may also combine each individual digital signal and store both digital signals as one stereo file. Preferably, the DSD 22 can hold up to 20 hours of musical sounds.

In accordance with a preferred embodiment, each six minute data increment results in the generation of an index number corresponding to that increment. For example, a six minute recording would have a 00 for an index number. A twelve minute recording would have two index numbers: 00 and 01. The index number 00 would represent the first six minutes of the recording and the index number 01 would represent the second 6 minutes of the recording.

The user of the device 10 can also insert electronic marker numbers at his or her discretion, using the input device (footswitch) 16. These markers would be time stamped and would be numbered beginning with the number 1. The user of the device 10 can issue a command (also using input device 16) to move directly to each marker. The application software program 19 controls this function of the device 10.

File names are created by using the date of the recording in month, day, and year format and the index number of the file. For example, a twelve minute recording created on Jan. 1, 1999 would result in two files having the file names 010199.000 and 010199.001.

A display 24 is electrically connected to a display output 56 on processor 14. The display 24 can be a three or four digit LED display typically found in the art. The display 24 displays the index number for the current file that is being recorded or being played. For example, when the recording and playback device 10 has been recording for 26 minutes (and thus the current index number is 04) the number 04 is displayed on the display 24. Likewise, when the recording and playback device 10 has been playing back a recording for two minutes, the number displayed on the display 24 is 00. Thus, the display can be used by the musician to locate and playback a specific portion of the recorded audio, using the displayed index numbers and/or markers. The display can also be used to provide visual command prompts to the user when a primary, record, or playback mode needs to be selected.

Thus, although there have been described particular embodiments of the present invention of a new and Musical Instrument Digital Recording Device with Communications Interface, it is not intended that such references be construed as limitations upon the scope of this invention except as set forth in the following claims.

What is claimed is:

1. A device for recording and playback of audio signals generated by a musical instrument that is external to the device, comprising:
    a musical instrument audio input connector adapted to mechanically and electrically receive an audio signal connection from the musical instrument;
    an input stage electrically connected to the musical instrument audio input connector, the input stage operable to receive the audio signals from the musical instrument and to convert the audio signals to digital audio signals;
    a processor linked to the input stage and operable to store during a record mode the digital audio signals on an internal storage device;
    an output stage linked to the processor and operable to convert the digital audio signals stored on the storage device to analog format during a playback mode;
    a communications port adapted for exchanging data with an external digital storage device, the communications port electrically connected to the processor; and
    an external control input device for generating control signals to the processor, the control signals including signals operable to activate the record and playback modes, the external control input device comprising a footswitch.

2. The device of claim 1, wherein the processor comprises a digital signal processor.

3. The device of claim 1, wherein the record mode comprises first, second, and third separate recording modes.

4. The device of claim 3, wherein the first recording mode is a continuous record mode.

5. The device of claim 4, wherein the second recording mode is a record on demand mode.

6. The device of claim 5, wherein the third recording mode comprises a search record mode.

7. The device of claim 1, wherein the internal storage device comprises a digital storage device.

8. The device of claim 7, wherein the digital storage device comprises a hard disk drive.

9. The device of claim 8, wherein the hard disk drive comprises an optical disk drive.

10. The device of claim 9, wherein the hard disk drive comprises a magnetic disk drive.

11. The device of claim 8, wherein the digital storage device comprises a non-volatile memory device.

12. The device of claim 11, wherein the non-volatile memory device comprises a FLASH memory card.

13. The device of claim 1, wherein the external control input device is hardwired to the processor.

14. The device of claim 1, wherein the external control input device is a multiple position footswitch.

15. The device of claim 1, wherein the audio signals from the musical instrument are analog signals and wherein the input stage includes an analog to digital converter.

16. The device of claim 1, wherein the control signals generated by the external control input device include marker signals corresponding to locations within the digital audio signals stored on the internal storage device designated by a user of the device.

17. The device of claim 1 wherein the input stage and output stage are responsive to the processor whereby the device can function in the record mode and playback mode concurrently.

18. The device of claim 17 wherein the processor and internal storage device are operable during the record mode to automatically overwrite previously recorded digital audio signals when the internal storage device has reached full capacity.

19. The device of claim 1, further comprising a display connected to the processor for displaying recording or playback.

20. The device of claim 19, wherein the display comprises a three digit LED display.

21. The device of claim 20, wherein the display comprises a four digit LED display.

22. The device of claim 1, wherein the communications port is a USB port.

23. The device of claim 1, further comprising an auxiliary analog audio output operably connected to the input stage.

24. The device of claim 1, further comprising an auxiliary digital output operably connected to the output stage.

25. The device of claim 1, wherein the processor includes means to automatically record new analog audio signals over old analog audio signals when the storage device is full.

26. The device of claim 1, further comprising:
processor software for controlling the processor, wherein the communications ports allows modification to the processor software to be downloaded.

27. The device of claim 1, wherein control commands can be provided to the processor through the communications port.

28. The device of claim 1, wherein the external control input device generates a control signal selected from a control signal group, wherein the control signal group includes a Play Next Index Signal, a Play Back Last Index Signal, a Play Back Last Marker Signal, a Play Back Search Marker Signal, a Signal Setting Signal, a Continuous Record Signal, a Record on Demand Signal, a Search Record Signal, and a File Dump Signal.

29. A device for recording and playback of audio signals generated by a musical instrument that is external to the device, comprising:
a musical instrument audio input connector adapted to mechanically and electrically receive an audio signal connection from the musical instrument;
input means electrically connected to the musical instrument audio input connector to receive the audio signals from the musical instrument;
input data converter means to convert the input audio signals into digital audio signals, the input converter means operably connected to the input means;
processor means operably linked to the input data converter means;
data storage means for storing the digital audio signals during a record mode, the data storage means internal to the device and operably connected to the processor means;
output converter means operably linked to the processor means and operable to convert the digital audio signals stored on the data storage means to audio output signals during a playback mode;
device control means for generating control signals to the processor, the control signals including signals operable to activate the record and playback modes, the device control means external to the device, the device control means including a footswitch; and
communications means operably linked to the processor means for exchanging data with an external digital storage device.

30. The device of claim 29 wherein the musical instrument audio input connector includes a first analog signal input jack adapted for direct connection to a cable from a musical instrument.

31. The device of claim 30 wherein the input means further comprises an output jack connected to the input jack.

32. The device of claim 31 wherein the musical instrument audio input connector includes a second analog signal input jack.

33. A device for recording and playback of audio signals generated by a musical instrument that is external to the device, comprising:
a musical instrument audio input connector adapted to mechanically and electrically receive an audio signal connection from the musical instrument;
an input stage electrically connected to the musical instrument audio input connector, the input stage operable to receive concurrent first and second channels of the audio signals from the musical instrument and separately convert the first and second channel audio signals to first and second digital audio signals;
a processor linked to the input stage and operable to store during a record mode both first and second digital audio signals on an internal storage device;
an output stage linked to the processor and operable to concurrently convert the first and second digital audio signals stored on the storage device to first and second output signals during a playback mode; and
an external control input device for generating control signals to the processor, the control signals including signals operable to activate the record and playback modes.

34. The device of claim 33, wherein the first and second output signals are output in a first set of digital output signals and a second set of analog output signals.

35. A device for recording and playback of audio signals generated by a musical instrument that is external to the device, comprising:
a musical instrument audio input connector adapted to mechanically and electrically receive an audio signal connection from the musical instrument;
an input stage electrically connected to the musical instrument audio input connector, the input stage operable to receive audio the signals from the musical instrument and to convert the audio signals to digital audio signals;
a processor linked to the input stage and operable to store during a record mode the digital audio signals on an internal storage device;
an output stage linked to the processor; and
an external control input device for generating control signals to the processor, the control signals including signals operable to activate the record and playback modes, wherein the external control input device comprises a footswitch.

36. The device of claim 35, wherein the external control input device is a multiple position footswitch.

37. A device for recording and playback of audio signals generated by a musical instrument that is external to the device, comprising:
a musical instrument audio input connector adapted to mechanically and electrically receive an audio signal connection from the musical instrument;
an input stage electrically connected to the musical instrument audio input connector, the input stage operable to receive the audio signals from the musical instrument and to convert the audio signals to digital audio signals;
a processor linked to the input stage and operable to store during a record mode the digital audio signals on an internal storage device;
an output stage linked to the processor and operable to convert the digital audio signals stored on the storage device to analog format during a playback mode;

a communications port adapted for exchanging data with an external digital storage device, the communications port electrically connected to the processor; and an external control input device for generating control signals to the processor, the control signals including signals operable to activate the record and playback modes, wherein the control signals generated by the external control input device include marker signals corresponding to locations within the digital audio signals stored on the internal storage device designated by a user of the device.

38. A device for recording and playback of audio signals generated by a musical instrument that is external to the device, comprising:

a musical instrument audio input connector adapted to mechanically and electrically receive an audio signal connection from the musical instrument;

an input stage electrically connected to the musical instrument audio input connector, the input stage operable to receive the audio signals from the musical instrument and to convert the audio signals to digital audio signals;

a processor linked to the input stage and operable to store during a record mode the digital audio signals on an internal storage device;

an output stage linked to the processor and operable to convert the digital audio signals stored on the storage device to analog format during a playback mode;

a communications port adapted for exchanging data with an external digital storage device, the communications port electrically connected to the processor;

an external control input device for generating control signals to the processor, the control signals including signals operable to activate the record and playback modes; and an auxiliary analog audio output operably connected to the input stage.

39. A device for recording and playback of audio signals generated by a musical instrument that is external to the device, comprising:

a musical instrument audio input connector adapted to mechanically and electrically receive an audio signal connection from the musical instrument;

an input stage electrically connected to the musical instrument audio input connector, the input stage operable to receive the audio signals from the musical instrument and to convert the audio signals to digital audio signals;

a processor linked to the input stage and operable to store during a record mode the digital audio signals on an internal storage device;

an output stage linked to the processor and operable to convert the digital audio signals stored on the storage device to analog format during a playback mode;

a communications port adapted for exchanging data with an external digital storage device, the communications port electrically connected to the processor;

an external control input device for generating control signals to the processor, the control signals including signals operable to activate the record and playback modes; and an auxiliary digital output operably connected to the output stage.

40. A device for recording and playback of audio signals generated by a musical instrument that is external to the device, comprising:

a musical instrument audio input connector adapted to mechanically and electrically receive an audio signal connection from the musical instrument;

an input stage electrically connected to the musical instrument audio input connector, the input stage operable to receive the audio signals from the musical instrument and to convert the audio signals to digital audio signals;

a processor linked to the input stage and operable to store during a record mode the digital audio signals on an internal storage device;

an output stage linked to the processor and operable to convert the digital audio signals stored on the storage device to analog format during a playback mode;

a communications port adapted for exchanging data with an external digital storage device, the communications port electrically connected to the processor; and an external control input device for generating control signals to the processor, the control signals including signals operable to activate the record and playback modes, wherein the external control input device generates a control signal selected from a control signal group, wherein the control signal group includes a Play Next Index Signal, a Play Back Last Index Signal, a Play Back Last Marker Signal, a Play Back Search Marker Signal, a Signal Setting Signal, a Continuous Record Signal, a Record on Demand Signal, a Search Record Signal, and a File Dump Signal.

* * * * *